United States Patent
Mayuzumi et al.

(10) Patent No.: US 9,876,109 B2
(45) Date of Patent: **\*Jan. 23, 2018**

(54) TRANSISTORS HAVING STRAINED CHANNEL UNDER GATE IN A RECESS

(71) Applicant: Micron Technology, Inc., Boise, ID (US)

(72) Inventors: Satoru Mayuzumi, Boise, ID (US); Mark Fischer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/465,936

(22) Filed: Mar. 22, 2017

(65) Prior Publication Data

US 2017/0194494 A1 Jul. 6, 2017

Related U.S. Application Data

(63) Continuation of application No. 14/245,092, filed on Apr. 4, 2014, now Pat. No. 9,640,656.

(51) Int. Cl.
*H01L 29/76* (2006.01)
*H01L 29/78* (2006.01)
(Continued)

(52) U.S. Cl.
CPC ........ *H01L 29/7842* (2013.01); *H01L 27/088* (2013.01); *H01L 27/10876* (2013.01);
(Continued)

(58) Field of Classification Search
CPC ............... H01L 29/7842; H01L 27/088; H01L 27/10876; H01L 29/0847; H01L 29/1054; H01L 29/165; H01L 27/2481
See application file for complete search history.

(56) References Cited

U.S. PATENT DOCUMENTS 6,323,525 B1 * 11/2001 Noguchi ............. H01L 21/2257
257/344
7,075,161 B2 7/2006 Barth
(Continued)

FOREIGN PATENT DOCUMENTS

WO PCT/US2015/010287 4/2015

OTHER PUBLICATIONS

Weiser, et al., "Strain Dependence of the Performance Enhancement in Strained-Si n-MOSFETs," IEEE, Solid State Electronics Laboratory, Stanford, CA, 1994, pp. 15.2.1-15.2.4.

*Primary Examiner* — Michael Jung
(74) *Attorney, Agent, or Firm* — Wells St. John P.S.

(57) ABSTRACT

Some embodiments include a construction having a second semiconductor material over a first semiconductor material. A region of the second semiconductor material proximate the first semiconductor material has strain due to different lattice characteristics of the first and second semiconductor materials. A transistor gate extends downwardly into the second semiconductor material. Gate dielectric material is along sidewalls and a bottom of the transistor gate. Source/drain regions are along the sidewalls of the transistor gate, and the gate dielectric material is between the source/drain regions and the transistor gate. A channel region extends between the source/drain regions and is under the bottom of the transistor gate. At least some of the channel region is within the strained region.

10 Claims, 4 Drawing Sheets

(51) Int. Cl.
  *H01L 27/088* (2006.01)
  *H01L 27/108* (2006.01)
  *H01L 29/08* (2006.01)
  *H01L 29/10* (2006.01)
  *H01L 29/165* (2006.01)
  *H01L 27/24* (2006.01)

(52) U.S. Cl.
  CPC ...... *H01L 27/2481* (2013.01); *H01L 29/0847* (2013.01); *H01L 29/1054* (2013.01); *H01L 29/165* (2013.01)

(56) References Cited

U.S. PATENT DOCUMENTS

| | | | |
|---|---|---|---|
| 8,324,699 B2 | 12/2012 | Ichijo | |
| 2001/0023133 A1* | 9/2001 | Hoke | H01L 21/28587 438/738 |
| 2004/0221792 A1 | 11/2004 | Forbes | |
| 2004/0247894 A1 | 12/2004 | Suvkhanov et al. | |
| 2007/0007571 A1* | 1/2007 | Lindsay | H01L 21/26586 257/306 |
| 2007/0048942 A1* | 3/2007 | Hanson | H01L 21/26513 438/268 |
| 2009/0283756 A1* | 11/2009 | Hellings | H01L 29/0843 257/24 |
| 2010/0096698 A1 | 4/2010 | Peidous | |
| 2011/0147713 A1 | 6/2011 | Pillarisetty | |
| 2011/0147798 A1 | 6/2011 | Radosavljevic et al. | |
| 2011/0226935 A1 | 9/2011 | Kawahito | |
| 2012/0080722 A1 | 4/2012 | Yin et al. | |
| 2012/0171820 A1 | 7/2012 | Waite et al. | |
| 2012/0261754 A1* | 10/2012 | Cheng | H01L 29/66772 257/347 |
| 2013/0082311 A1 | 4/2013 | Chang | |
| 2013/0292698 A1* | 11/2013 | Then | H01L 29/4236 257/76 |
| 2014/0054713 A1 | 2/2014 | Lee et al. | |
| 2014/0117380 A1 | 5/2014 | Loboda | |
| 2014/0167164 A1* | 6/2014 | Adam | H01L 29/66545 257/347 |
| 2014/0197376 A1 | 7/2014 | Ma | |
| 2014/0264273 A1* | 9/2014 | Howell | H01L 29/7784 257/20 |
| 2014/0306250 A1 | 10/2014 | Gardner | |

\* cited by examiner

TRANSISTORS HAVING STRAINED CHANNEL UNDER GATE IN A RECESS

RELATED PATENT DATA

This patent resulted from a continuation of U.S. patent application Ser. No. 14/245,092, which was filed Apr. 4, 2014, which issued as U.S. Pat. No. 9,640,656 and which is hereby incorporated herein by reference.

TECHNICAL FIELD

Transistors, memory arrays and semiconductor constructions.

BACKGROUND

Transistors are commonly utilized in integrated circuits and may have many applications throughout memory, logic, etc. For instance, transistors may be utilized in resistive random access memory (RRAM) arrays, dynamic random access memory (DRAM) arrays, etc.

A continuing goal of integrated circuit fabrication is to create higher levels of integration, and accordingly to reduce size and spacing of existing components. It is becoming increasingly difficult to reduce the size of transistors due to small channel effects and other complications.

Transistor performance may be characterized by numerous metrics, including, for example, drive current (i.e., current flow through the on state ($I_{on}$) of the transistor). In some applications, it would be desirable to develop transistors having one or more improved metrics (for instance, enhanced drive current) relative to conventional transistors.

BRIEF DESCRIPTION OF THE DRAWINGS

FIGS. 5A and 5B are a diagrammatic cross-sectional side view and a diagrammatic top view of a region an example embodiment memory array, respectively. FIG. 5A is along the cross-section b-b' of FIG. 5B.

DETAILED DESCRIPTION OF THE ILLUSTRATED EMBODIMENTS

Some embodiments include transistors having channel regions which extend within strained semiconductor material. The strained semiconductor material may improve electron mobility within the channel regions and thereby improve drive current. The transistors may be utilized in recessed access devices, and in some embodiments may be utilized in buried recessed access devices (BRADs). Example embodiments are described with reference to FIGS. 1-5.

Figure 1:
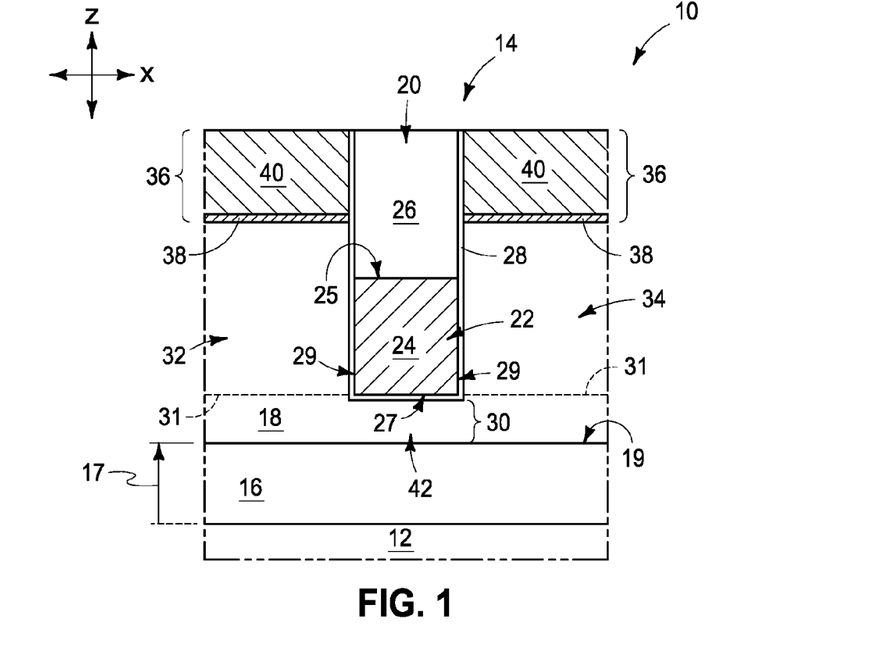
FIGS. 1-4 are diagrammatic cross-sectional views of regions of semiconductor constructions comprising example embodiment transistors.

Referring to FIG. 1, a construction 10 comprises a recessed transistor 14 supported over a semiconductor base 12.

The base 12 may comprise semiconductor material, and may, for example, comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12 and/or may be laterally adjacent the shown region of base 12; and may correspond to, for example, one or more of refractory metal materials, barrier materials, diffusion materials, insulator materials, etc.

A first semiconductor material 16 is formed over base 12, and a second semiconductor material 18 is formed over the first semiconductor material. The first and second semiconductor materials are different from one another, and in the shown embodiment join along an interface 19. Strain is induced in semiconductor material proximate interface 19 due to different lattice characteristics of the first and second semiconductor materials. The strained region may be spread across a volume that extends outwardly from the interface 19. Specifically, the strained region may extend a substantial distance upwardly into second semiconductor material 18, and possibly also downwardly into the first semiconductor material 16. The term "strained region" is utilized to refer to regions which contain strain from lattice mismatch between materials 16 and 18. Such strained regions may, for example, extend 20 nm or more into semiconductor material 18 relative to the interface where materials 16 and 18 join.

In some embodiments, the second semiconductor material 18 may comprise, consist essentially of, or consist of silicon; and the first semiconductor material 16 may comprise elements other than silicon selected from group IV of the periodic table (e.g., carbon, germanium, etc.). In some embodiments, the first semiconductor material 16 may comprise silicon in combination with one or more other elements from group IV of the periodic table; and may, for example, comprise silicon in combination with one or both of carbon and germanium. For instance, the first semiconductor material may comprise, consist essentially of, or consist of $Si_{(1-x)}Ge_x$; where x is within a range of from about 0.2 to about 0.5.

In embodiments in which the first semiconductor material 16 comprises silicon in combination with one or more other materials from group IV of the periodic table, and in which second semiconductor material 18 comprises silicon; the first semiconductor material may comprise a single uniform ratio of silicon to other components throughout its entirety, or may comprise a gradient of silicon concentration relative to the concentration of other components. For instance, in some embodiments the first semiconductor material 16 may comprise silicon in combination with one or both of carbon and germanium, and the concentration of silicon may reduce along a gradient 17 such that there is a lower silicon concentration in proximity to interface 19 than deeper within material 16. Such may enable strain characteristics to be tailored for specific applications.

The first and second semiconductor materials 16 and 18 may comprise any suitable materials; and in some embodiments the first semiconductor material 16 may comprise a II/V mixture (e.g., cadmium phosphide, cadmium arsenide, zinc phosphide, etc.), a II/VI mixture (e.g., cadmium selenide, cadmium sulfide, zinc selenide, zinc telluride, etc.) or a IV/VI mixture (e.g., lead(II) selenide, tin sulfide, thallium germanium telluride, etc.); and the second semiconductor material 18 may comprise a different mixture, or may comprise, consist essentially of, or consist of silicon.

The first semiconductor material 16 may comprise any suitable thickness, and in some embodiments may have a thickness of less than about 2 µm; such as, for example, a thickness within a range of from about 1 µm to about 2 µm.

A recess 20 extends into the second semiconductor material 18. A transistor gate 22 is at the bottom of such recess, and may be considered to extend downwardly into the second semiconductor material 18. The transistor gate comprises a gate material 24. The gate material may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.).

An electrically insulative material 26 is within recess 20 and over the gate 22. The insulative material 26 may comprise any suitable composition or combination of compositions; and in some embodiments may comprise, consist essentially of, or consist of silicon nitride.

The gate 22 may be considered to comprise a top surface 25 adjacent insulative material 26, a bottom surface 27 in opposing relation to the top surface, and sidewall surfaces 29.

Gate dielectric material 28 extends along the bottom surface 27 and the sidewall surfaces 29 of gate 22. In the shown embodiment, the gate dielectric material also extends along sidewall surfaces of insulative material 26; but in other embodiments the gate dielectric material may be only along surfaces of gate 22.

The gate 22 may be part of a wordline that extends in and out of the page relative to the cross-sectional view of FIG. 1.

The bottom 27 of gate 22 may be considered to be over an intervening region 30 of semiconductor material 18, with such intervening region being between the gate and the first semiconductor material 16. The intervening region may, for example, have a thickness within a range of from about 10 nm to about 20 nm. Strain induced by lattice mismatch of materials 16 and 18 may propagate entirely through the intervening region 30.

Source/drain regions 32 and 34 are along sidewalls of gate 22, and are spaced from the gate by the gate dielectric material 28. The source/drain regions may correspond to conductively-doped regions of semiconductor material 18, and bottoms of the source/drain regions are diagrammatically illustrated with dashed lines 31. The bottoms of the source/drain regions may be diffuse boundaries where dopant concentration decreases to a level below that associated with source/drain regions, rather than being abrupt steps. Although both of the source/drain regions are shown extending to about the same depth as one another, in other embodiments the source/drain regions may extend to different depths relative to one another.

In the embodiment of FIG. 1, the source/drain regions extend to a depth approximately equal with a depth of the gate 22 within semiconductor material 18. In other embodiments, the source/drain regions may extend to different depths relative to the depth of gate 22, as discussed in more detail below with reference to FIGS. 2-4.

FIG. 1 shows electrically conductive regions 36 over the source/drain regions 32 and 34. In the illustrated embodiment, such electrically conductive regions comprise a first electrically conductive material 38 and a second electrically conductive material 40. The electrically conductive material 38 may comprise, for example, metal silicide (e.g., titanium silicide, cobalt silicide, etc.), and the electrically conductive material 40 may comprise metal (for example, tungsten, titanium, etc.) or metal-containing compositions (for instance, metal carbide, metal nitride, etc.). The electrically conductive regions 36 may be utilized for forming electrical contact to source/drain regions 32 and 34, and may be replaced with any other suitable structures in other embodiments.

A channel region 42 extends between source/drain regions 32 and 34, and under the bottom of the transistor gate 22. The strain induced by lattice mismatch of materials 16 and 18 may extend at least partially across intervening region 30, and specifically may extend at least partially across the channel region. Such may enable electron mobility across the channel region to be enhanced, which can enable transistor 14 to have higher drive current than conventional transistors. In some embodiments, an entirety of channel region 42 may be within strained semiconductor material.

In some example embodiments (for instance, embodiments in which the second semiconductor material 18 comprises silicon, and the first semiconductor material 16 comprises $Si_{(1-x)}Ge_x$ (where, for example, x is within a range of from about 0.2 to about 0.5)), strain across intervening region 30 may be calculated using piezoresistance coefficients:

$$\frac{\mu_{e(xx)}}{\mu_0} = 1 + 0.316 S_{xx} + 0.176 S_{yy} - 0.534 S_{zz}$$

In the equation above, $\mu_{e(xx)}$, $\mu_0$, $S_{xx}$, $S_{yy}$ and $S_{zz}$ are the electron mobility with strain in the x-axis, electron mobility without stress, and channel stress along the x-axis, y-axis and z-axis, respectively. The equation is provided for n-type MOSFETs to assist the reader in understanding the invention, and is not to limit any aspect of the invention except to the extent, if any, that such equation is expressly recited in the claims which follow. Orientations of an x-axis and z-axis are shown relative to the construction of FIG. 1.

An advantage of the embodiment of FIG. 1 is that electrons migrate primarily along the x-axis direction within channel region 42, and do not have substantial migration along the z-axis direction. According, the strain within intervening region 30 may have substantial impact on mobility of electrons within the channel region.

The channel region 42 may be majority doped to an opposite-type than the source/drain regions 32 and 34. For instance, the channel region 42 may be a p-type doped region and the source/drain regions 32 and 34 may be n-type doped regions. In some embodiments, the channel region 42 may be doped to a threshold voltage ($V_T$) implant level, and the source/drain regions 32 and 34 may be doped to lightly doped diffusion (LDD) implant levels.

Figure 2:
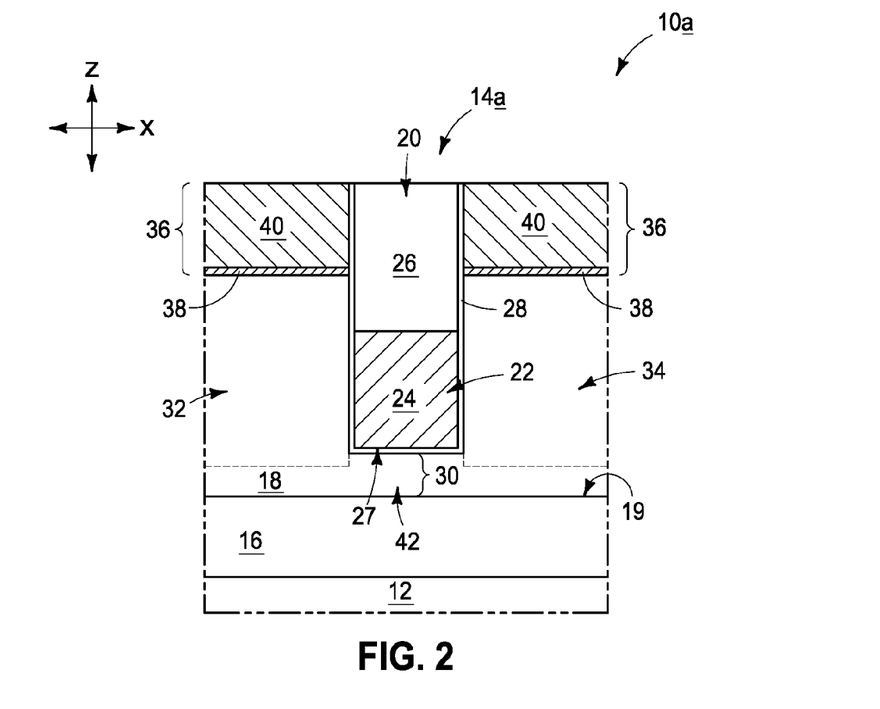

The embodiment of FIG. 1 comprises a transistor with source/drain regions having bottoms approximately coextensive with a bottom of a transistor gate. FIG. 2 shows a construction 10a illustrating an alternative embodiment in which bottoms of the source/drain regions extend to beneath the bottom of the transistor gate. Specifically, FIG. 2 shows a transistor 14a having source/drain regions 32 and 34 which extend deeper within semiconductor material 18 than the transistor gate 22. In some embodiments, intervening region 30 may have a thickness within a range of from about 10 nm to about 20 nm, and the source/drain regions 32 and 34 may extend to a depth greater than the depth of gate 22 by an amount within a range of from about 5 nm to about 10 nm. Accordingly, the source/drain regions 32 and 34 may extend to a depth which is three-quarters of the thickness of the intervening region 30, one-half of the thickness of the intervening region 30, etc.

The channel region 42 may be entirely within a strained region of semiconductor material 18 in the embodiment of FIG. 2, and electron mobility within the channel region may be primarily along the x-axis direction. Accordingly, advantages described above with reference to FIG. 1 may be fully realized to enable high drive current.

Figure 3:
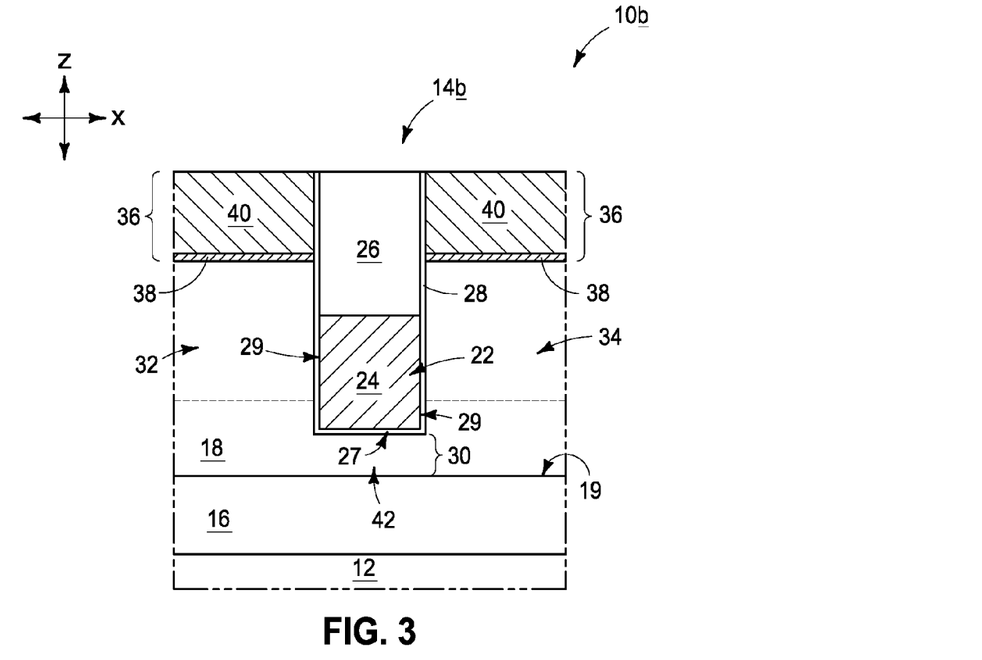

FIG. 3 shows another example embodiment transistor. Specifically, FIG. 3 shows a construction 10b comprising a transistor 14b having source/drain regions 32 and 34 which are less deep than the gate 22. The transistor 14b comprises a channel region 42 which is partially within the intervening region 30 along the bottom 27 of gate 22, but which also extends along lowermost portions of the sidewalls 29 of gate 22. The transistor 14b may have a couple of disadvantages relative to the transistors 14 and 14a of FIGS. 1 and 2. First, some of the channel region 42 may extend beyond a strained region of semiconductor material 18. Specifically, the strained region of semiconductor material 18 may encompass intervening region 30, but may or may not extend all the way up to the illustrated bottom boundaries of source/drain regions 32 and 34. If some of the channel region is outside of the strained region of semiconductor material 18, then advantages of enhanced electron mobility within strained semiconductor material may be realized only by the portion of the channel region within the strained region of semiconductor material 18 rather than by the entirety of the channel region. A second disadvantage of transistor 14b is that there is substantial electron migration along the z-axis direction, as well as along the x-axis direction, and such may reduce advantages of enhanced electron mobility as compared to the transistors 14 and 14a of FIGS. 1 and 2 in which electron migration is primarily along the x-axis direction.

Although both of the source/drain regions are shown extending to a same depth as one another, in other embodiments the source/drain regions may extend to different depths relative to one another. For instance, one of the source/drain regions may extend to a depth at least equal to a depth of the transistor gate, and the other may extend to a depth less than a depth of the transistor gate. Accordingly, the channel region may be asymmetric, with one side of the channel region extending along a sidewall of the gate (like the embodiment of FIG. 3) and another side not extending along a sidewall (like the embodiment of FIG. 1 or FIG. 2). Such asymmetric channel regions may have properties and characteristics (for instance, strained-region induced drive current enhancement) which are intermediate between the embodiment of FIG. 3 and the embodiments of FIGS. 1 and 2.

Even though transistor 14b of FIG. 3 may have disadvantages relative to the embodiments of FIGS. 1 and 2, the transistor 14b may still have enhanced drive current relative to conventional transistors, and accordingly may still be an improved device suitable for utilization in some applications.

Figure 4:
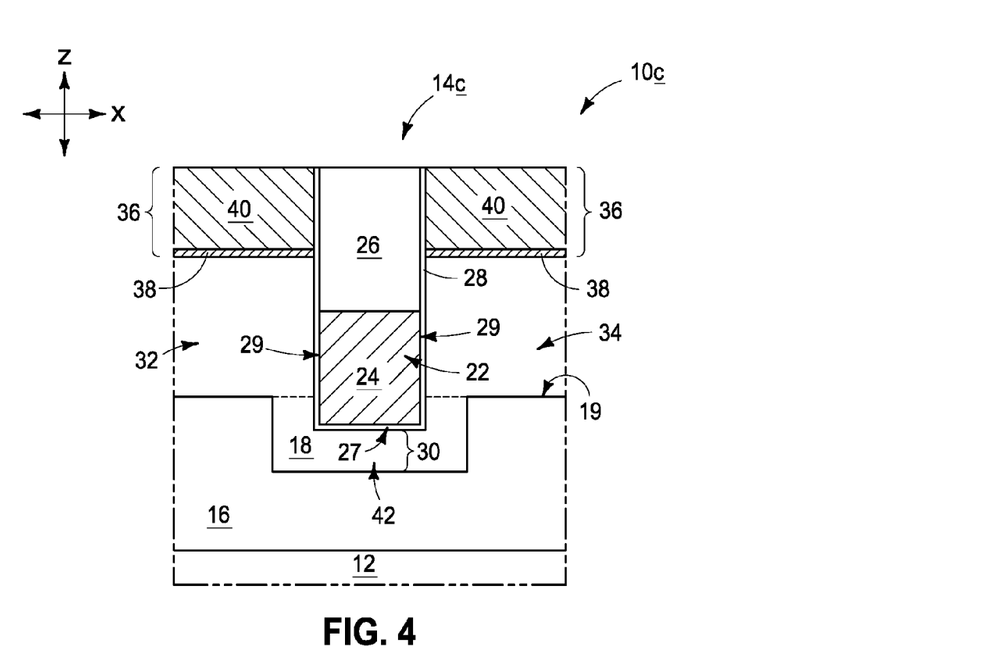

In some embodiments, the topography across an upper surface of semiconductor material 16 may be modified so that an entirety of the channel region is within strained material in embodiments in which the source/drain regions extend less deep than the gate of a transistor. For instance, FIG. 4 shows a construction 10c comprising a transistor 14c similar to the transistor 14b of FIG. 3 in that the source/drain regions 32 and 34 of transistor 14c do not extend as deep as the gate 22. However, interface 19 is configured to have a container shape. Such container shape is complementary to an outer perimeter of gate 22 along the bottom 27 and along lower-most segments of the sidewalls 29. Accordingly, channel 42 is container-shaped, and nested within the container-shaped configuration of interface 19.

The channel region 42 has a substantially consistent thickness along the lower-most segments of sidewalls 29 and along the bottom 27 of gate 22 in the shown embodiment, but in other embodiments may have a different thickness along the sidewalls 29 than along the bottom 27 of the gate.

In some embodiments, strain within channel region 42 may be kept substantially consistent throughout the entirety of the channel region, and specifically throughout portions of the channel region along sidewalls 29 as well as throughout the portion along the bottom 27 of gate 22. Accordingly, high electron mobility may extend entirely throughout the channel region 42, and the drive current of transistor 14c of FIG. 4 may be comparable to the drive currents of the embodiments of FIGS. 1 and 2 even though the source/drain regions 32 and 34 are less deep than the gate 22.

Figure 5A:
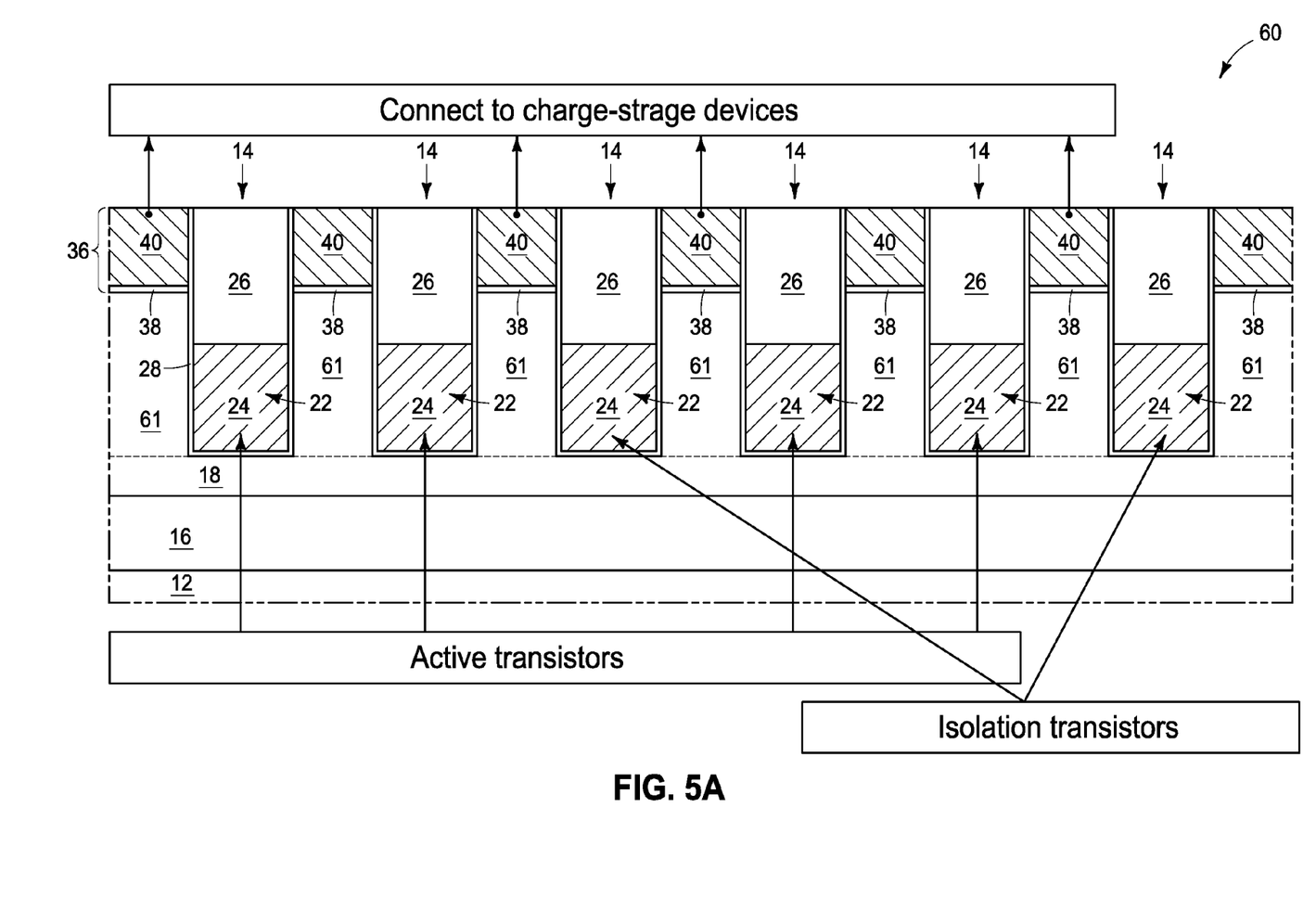
Figure 5B:
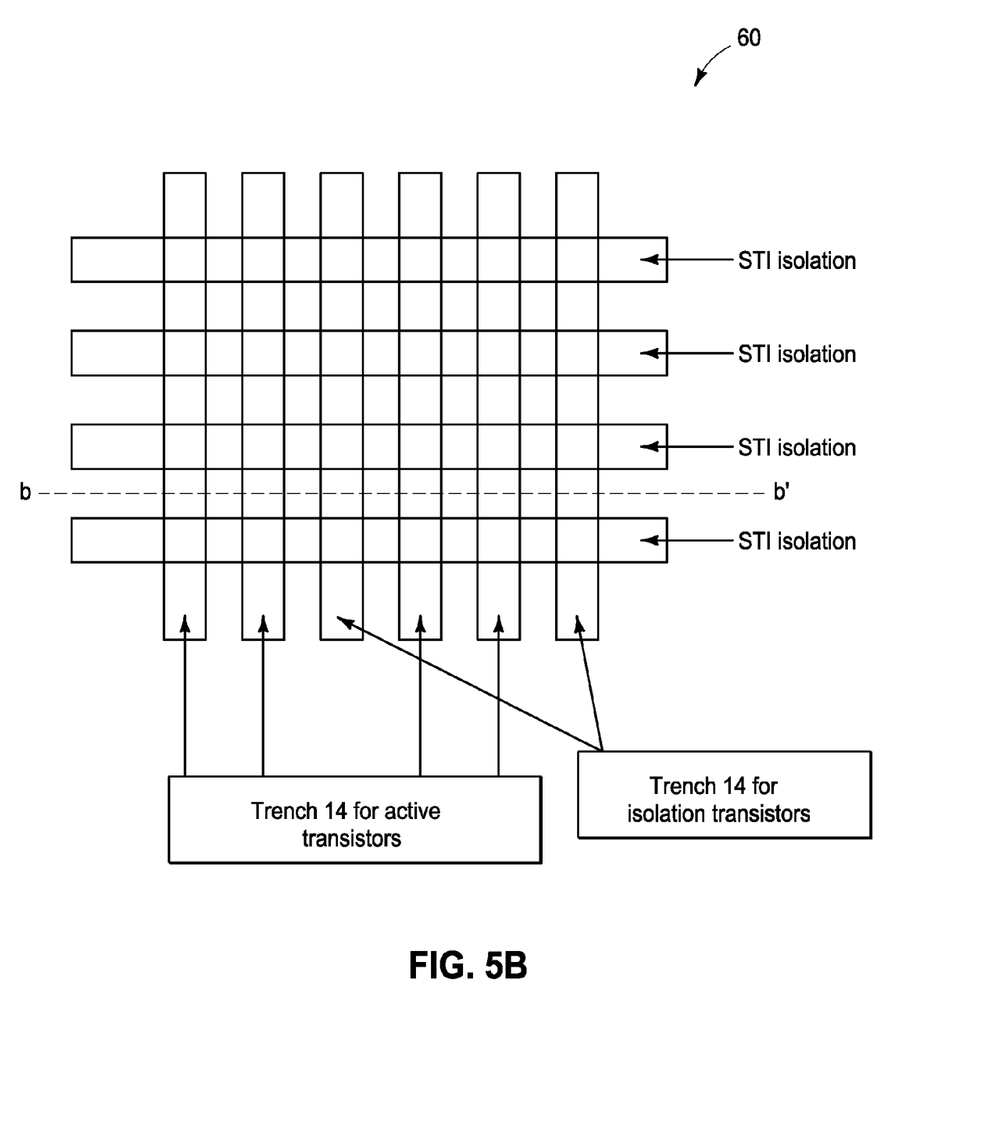

In some applications, the transistor embodiments described above may be incorporated into memory arrays, such as, for example, RRAM arrays, DRAM arrays, etc. FIGS. 5A and 5B show an example array 60 comprising a plurality of substantially identical transistors 14 of the type described above with reference to FIG. 1, (with the term "substantially identical" meaning that the transistors are identical to within reasonable tolerances of fabrication and measurement). The source/drain regions are labeled as regions 61 in FIG. 5A, and are the same as the regions 32/34 of FIG. 1.

In the shown embodiment, some of the transistors are "active" and electrically coupled with charge-storage devices; and others are utilized for isolation regions. The isolation regions are utilized to isolate some of the adjacent active transistors from one another. Bitlines (not shown) may be electrically coupled to some of the source/drain regions of the active transistors. The gates 22 of the active transistors may be along wordlines that extend in and out of the page relative to the cross-section of FIG. 5A. Shallow trench isolation (STI) extends within trenches orthogonal to the trenches comprising the active and isolation transistors, as shown in the top view of FIG. 5B.

The devices and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a semiconductor construction which comprises a second semiconductor material over a first semiconductor material, and having a strained region proximate the first semiconductor material due to different lattice characteristics of the first and second semiconductor materials. A transistor gate extends downwardly into the second semiconductor material. Gate dielectric material is along sidewalls and a bottom of the transistor gate. Source/drain regions are along the sidewalls of the transistor gate, and the gate dielectric material is between the source/drain regions and the transistor gate. A channel region extends between the source/drain regions and is under the bottom of the transistor gate. At least some of the channel region is within the strained region.

Some embodiments include a semiconductor construction which comprises a first semiconductor material adjacent to a second semiconductor material. The second semiconductor material has a strained region due to different lattice characteristics of the first and second semiconductor materials. A transistor gate extends into the second semiconductor material. An intervening region of the second semiconductor material is between a bottom of the transistor gate and the first semiconductor material. An entirety of the intervening region is encompassed by the strained region. Gate dielectric material is along sidewalls and the bottom of the transistor gate. Source/drain regions are along the sidewalls of the transistor gate, and are spaced from the transistor gate by the gate dielectric material. The source/drain regions extend into the second semiconductor material to a depth at least about equal to a depth of the transistor gate within the second semiconductor material. A channel region extends between the source/drain regions and under the bottom of the transistor gate.

Some embodiments include a semiconductor construction which comprises a first semiconductor material and a second semiconductor material joining the first semiconductor material along an interface. A region of the second semiconductor material proximate the interface has strain due to different lattice characteristics of the first and second semiconductor materials. A transistor gate extends into the second semiconductor material. An intervening region of the second semiconductor material is between a bottom of the transistor gate and the first semiconductor material. An entirety of the intervening region is encompassed by the strained region. Gate dielectric material is along sidewalls and the bottom of the transistor gate. Source/drain regions are along the sidewalls of the transistor gate, and are spaced from the transistor gate by the gate dielectric material. The source/drain regions extend into the second semiconductor material to a depth less than a depth of the transistor gate within the second semiconductor material. A channel region extends between the source/drain regions and under the bottom of the transistor gate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
   a first semiconductor material;
   a second semiconductor material over the first semiconductor material and having a strained region proximate the first semiconductor material;
   a transistor gate extending downwardly into the second semiconductor material;
   conductively-doped source/drain regions proximate sidewalls of the transistor gate and extending downwardly into the second semiconductor material;
   a channel region extending between the conductively-doped source/drain regions and under the bottom of the transistor gate, at least some of the channel region being within the strained region;
   wherein upper surfaces of the conductively-doped source/drain regions are above an upper surface of the transistor gate; and
   wherein the first semiconductor material comprises germanium and the second semiconductor material comprises silicon.

2. The semiconductor construction of claim 1 wherein the source/drain regions are less deep than the transistor gate within the second semiconductor material.

3. The semiconductor construction of claim 1 wherein the channel region is container-shaped; and wherein an interface where the first and second semiconductor materials join is configured to be container-shaped, with the container-shaped channel region being nested within the container-shaped interface.

4. A semiconductor construction, comprising:
   a first semiconductor material;
   a second semiconductor material over the first semiconductor material and having a strained region proximate the first semiconductor material;
   a transistor gate extending downwardly into the second semiconductor material;
   conductively-doped source/drain regions proximate sidewalls of the transistor gate and extending downwardly into the second semiconductor material;
   a channel region extending between the conductively-doped source/drain regions and under the bottom of the transistor gate, at least some of the channel region being within the strained region;

wherein upper surfaces of the conductively-doped source/drain regions are above an upper surface of the transistor gate; and wherein the first semiconductor material comprises a mixture of germanium and silicon, and wherein the second semiconductor material comprises silicon.

5. A semiconductor construction, comprising:

a first semiconductor material;

a second semiconductor material over the first semiconductor material and joining the first semiconductor material along an interface; a strained region of the second semiconductor material being proximate the interface;

a transistor gate extending into the second semiconductor material;

an intervening region of the second semiconductor material being between a bottom of the transistor gate and the first semiconductor material; an entirety of the intervening region being encompassed by the strained region;

dielectric material along sidewalls and the bottom of the transistor gate;

source/drain regions proximate the transistor gate, and spaced from the transistor gate by the dielectric material; the source/drain regions extending into the second semiconductor material to a depth less than a depth of the transistor gate within the second semiconductor material;

wherein a channel region extends between the source/drain regions and under the bottom of the transistor gate;

wherein the second semiconductor material comprises silicon; and wherein the first semiconductor material comprises a mixture of germanium and silicon.

6. The semiconductor construction of claim 5 wherein the channel region is container-shaped; and wherein the interface is also container-shaped, with the container-shaped channel region being nested within the container-shaped interface.

7. The semiconductor construction of claim 5 wherein a thickness of the channel region is substantially consistent along an entirety of the channel region.

8. A semiconductor construction, comprising:

a first semiconductor material;

a second semiconductor material over the first semiconductor material and joining the first semiconductor material along an interface; a strained region of the second semiconductor material being proximate the interface;

a transistor gate extending into the second semiconductor material;

an intervening region of the second semiconductor material being between a bottom of the transistor gate and the first semiconductor material; an entirety of the intervening region being encompassed by the strained region;

dielectric material along sidewalls and the bottom of the transistor gate;

source/drain regions proximate the transistor gate, and spaced from the transistor gate by the dielectric material; the source/drain regions extending into the second semiconductor material to a depth less than a depth of the transistor gate within the second semiconductor material;

wherein a channel region extends between the source/drain regions and under the bottom of the transistor gate;

wherein the second semiconductor material comprises silicon; and wherein the first semiconductor material comprises a mixture of germanium and carbon.

9. A semiconductor construction, comprising:

a first semiconductor material;

a second semiconductor material over the first semiconductor material and joining the first semiconductor material along an interface; a strained region of the second semiconductor material being proximate the interface;

a transistor gate extending into the second semiconductor material;

an intervening region of the second semiconductor material being between a bottom of the transistor gate and the first semiconductor material; an entirety of the intervening region being encompassed by the strained region;

dielectric material along sidewalls and the bottom of the transistor gate;

source/drain regions proximate the transistor gate, and spaced from the transistor gate by the dielectric material; the source/drain regions extending into the second semiconductor material to a depth less than a depth of the transistor gate within the second semiconductor material;

wherein a channel region extends between the source/drain regions and under the bottom of the transistor gate;

wherein the second semiconductor material comprises silicon; and wherein the first semiconductor material comprises a II/VI mixture, a IV/VI mixture or a II/V mixture.

10. The semiconductor construction of claim 9 wherein a portion of the channel region is not within the strained region.

* * * * *